United States Patent
Dhanwada et al.

(10) Patent No.: US 9,217,771 B2
(45) Date of Patent: Dec. 22, 2015

(54) METHOD FOR BREAKING DOWN HARDWARE POWER INTO SUB-COMPONENTS

(71) Applicant: INTERNATIONAL BUSINESS MACHINES CORPORATION, Armonk, NY (US)

(72) Inventors: Nagashyamala R. Dhanwada, Fishkill, NY (US); Anand Haridass, Bangalore (IN); Arun Joseph, Bangalore (IN); Charles R. Lefurgy, Austin, TX (US); Diwesh Pandey, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 14/154,209

(22) Filed: Jan. 14, 2014

(65) Prior Publication Data

US 2015/0198660 A1  Jul. 16, 2015

(51) Int. Cl.
*G01R 31/28* (2006.01)
*G06F 1/26* (2006.01)

(52) U.S. Cl.
CPC .............. *G01R 31/2875* (2013.01); *G06F 1/26* (2013.01)

(58) Field of Classification Search
CPC ......... G06F 1/26; G06F 1/206; G06F 1/3206; G06F 1/3203; G06F 1/3243; G01R 31/025; G01R 21/02; G01R 22/00; G01R 22/10; G01R 31/28; G01R 31/3004; G01R 31/3008
USPC .......... 713/300, 320, 340; 324/750.3, 762.01, 324/764.01; 702/58, 60, 132
See application file for complete search history.

(56) References Cited

U.S. PATENT DOCUMENTS

| | | |
|---|---|---|
| 6,842,714 B1 | 1/2005 | Acar et al. |
| 7,814,339 B2 | 10/2010 | Monferrer et al. |
| 2003/0125900 A1 | 7/2003 | Orenstien et al. |

(Continued)

FOREIGN PATENT DOCUMENTS

WO   WO 2006/024325 A1   3/2006

OTHER PUBLICATIONS

Huang et al., "TAPO: Thermal-Aware Power Optimization Techniques for Servers and Data Centers", Green Computing Conference and Workshops (IGCC), Jul. 25-28, 2011, pp. 1-8.
Huang et al., "Accurate Fine-Grained Processor Power Proxies", Microarchitecture (Micro), 2012 45th Annual IEEE/ACM International Symposium, Dec. 1-5, 2012, pp. 224-234.

(Continued)

*Primary Examiner* — Arleen M Vazquez
*Assistant Examiner* — Neel Shah
(74) *Attorney, Agent, or Firm* — Scully, Scott, Murphy & Presser, P.C.; Steven Meyers, Esq.

(57) ABSTRACT

A system, method and computer program product for enabling efficient and accurate post-silicon leakage power characterization of semiconductor chips at very high temperatures. The system and method can be used to estimate dynamic power usage at a sub-component level. The system and method determines leakage power during test time while running a workload in a manner such that a wider range of temperatures can be characterized on a tester that does not have precise temperature control, i.e., does not require or use external heaters. Additional power management functionality for a semiconductor device is provided while running a workload that breaks down total power measured into workload dependent and workload-independent subcomponents.

20 Claims, 8 Drawing Sheets

(56) References Cited

U.S. PATENT DOCUMENTS

2006/0167657 A1* 7/2006 Naffziger et al. ............. 702/182
2007/0001694 A1* 1/2007 Jahagirdar et al. ............ 324/760
2007/0005152 A1   1/2007 Karr et al.
2011/0291746 A1  12/2011 Ibrahim et al.
2014/0095904 A1* 4/2014 Ananthakrishnan et al. . 713/320

OTHER PUBLICATIONS

Isci et al., "Runtime Power Monitoring in High-End Processors: Methodology and Empirical Data", Microarchitecture, 2003, Micro-36, Proceedings 36th Annual IEEE/ACM International Symposium, Dec. 3-5, 2003, pp. 93-104.

* cited by examiner

| RAIL VOLTAGE (V) | TEMPERATURE (T) | WORKLOAD INDEPENDENT POWER |
|---|---|---|
| 1.1 | 85 | 100W |
| 1.12 | 86 | 105W |
| 1.2 | 110 | 120W |
| 1.2 | 115 | 125W |
| 1.2 | 120 | 130W |
| 0.9 | 45 | 60W |
| ... | ... | ... |

METHOD FOR BREAKING DOWN HARDWARE POWER INTO SUB-COMPONENTS

BACKGROUND

This disclosure relates generally to dynamic power management techniques implemented for semiconductor chips, and particularly to novel system and method for estimating dynamic power usage at a sub-component level when operating under workload conditions.

Current approaches to dynamic power estimation include use of hardware performance counters. This requires dedicated hardware counters, software techniques to access those counters, and algorithms to map counter readings to power estimates in semiconductor Integrated Circuits (ICs or chips).

There are currently known techniques and methods for runtime power monitoring in high-end processors. For example, use of accurate fine-grained processor power proxies is well established for obtaining chip dynamic power estimates.

Other approaches to dynamic power estimation include estimating whole chip power using activity counters, voltage, and frequency measurements.

Other known solutions include using temperature and voltage measurements to estimate leakage in the chips. Other solutions use real-time voltage, temperature, and pre-determined constants to compute leakage power. The constants are used to scale the leakage power according to using many temperature points that represent unequal (in terms of leakage) parts of the chip.

Still other techniques teach use of a pre-populated look-up table indexable by temperature and voltage to find a leakage power entry. Use of such table is triggered on device reset to avoid overuse of a multiply accumulator. Further teachings include using an on-chip micro or off-chip micro to compute the leakage equation. Constants are typically determined at manufacturing time.

Further teachings in the art include measuring voltage, measuring temp, and multiplying associated scalars with a reference leakage power value determined at manufacturing time to determine real-time leakage.

Further, there are currently implemented so-called "Power Proxies" that are chip-level and core-level power proxies where hardware (HW) is used to compute activity per-core (HW computes activity proxy). Such hardware includes as much as 50 activity counters in IBM's POWER 7+ processor's architecture, and the technique includes periodically tracking changes in voltage, frequency, temperature, and workload activity.

Further systems obtain leakage power measurements at manufacturing time, e.g., measured voltage and measured temperature, and these measurements are used to find runtime leakage.

Other techniques include estimating computer power by using an instruction trace and model of instruction power (simulation).

A major problem for these prior art devices is that they are hardware intensive and entirely accurate, especially as they omit leakage estimation at workload conditions, i.e., when executing or running.

It would be desirable to provide a system and method to enable accurate post-silicon leakage power characterization at very high temperatures, and at a much wider range of temperature and voltages, without the need for costly tester/heating infrastructure.

SUMMARY

A system and method to determine power breakdown of semiconductor chips (integrated circuits or ICs) using real power measurements.

A system and method that enables efficient and accurate post-silicon leakage power characterization of semiconductor chips at very high temperatures.

The system and method determines leakage power during a post-silicon leakage power characterization test time while running a workload in a manner such that a wider range of temperatures are characterized on a tester that does not have precise temperature control, i.e., does not require or use external heaters.

The system and method provide additional power management functionality that breaks down hardware power measurements into sub-components.

The additional power management functionality implements a technique to accurately break down total hardware power, while running a workload, into workload dependent and workload-independent subcomponents, without the need for additional hardware techniques/counters.

The system and method determines leakage power by leveraging dynamic power at high utilization workloads to produce heat, and then separates leakage power from dynamic power. In this manner the system and method runs on a lower-cost test infrastructure, since the workload provides heating.

Further to this, the system and method sorts hardware sub-components of the IC according to a break down of dynamic hardware power per frequency domain.

Thus, in one aspect, there is provided a method of obtaining leakage power value for an integrated circuit (IC) chip having hardware processing components. The method comprises: a) running a programmed workload on a hardware processing component of the IC, the hardware component operating at an applied first voltage supply rail and temperature combination; b) measuring a first total power consumed for the hardware processing component of the IC from a measurable point thereof; c) computing a workload dependent measure of dynamic power of a frequency domain N with the hardware component operating at a frequency $F_N$; d) increasing a clock frequency input applied to the hardware component that results in an increase in the total power consumed by the hardware component associated with a domain N; e) measuring a second total power consumed for the hardware processing component operating at the increased frequency; f) computing a difference between the first and second measured total power; g) computing a factor representing a workload dependent dynamic power value of that frequency domain N as a function of the computed measured total power difference and the clock frequency increase amount, and storing the workload dependent dynamic power of that frequency domain N; h) obtaining a factor representing a workload dependent dynamic power value at each other frequency domain N associated with the hardware processing component of the IC; i) calculating a total workload dependent dynamic power value as a sum of all obtained workload dependent dynamic power values at all frequency domains; and j) computing a workload independent leakage power component value as the difference between the first total power measured and the calculated total workload dependent dynamic power value at the first rail voltage and temperature.

In a further aspect, there is provided a system for obtaining leakage power value for an integrated circuit (IC) chip having hardware processing components. The system includes a memory storage device and a processor device in communication with the memory storage device. The processor device is configured to perform a method to: a) run a programmed workload on a hardware processing component of the IC, the hardware component operating at an applied first voltage supply rail and temperature combination; b) measure a first total power consumed for the hardware processing component of the IC from a measurable point thereof; c) compute a workload dependent measure of dynamic power of a frequency domain N with the hardware component operating at a frequency $F_N$; d) increase a clock frequency input applied to the hardware component that results in an increase in the total power consumed by the hardware component associated with a domain N; e) measure a second total power consumed for the hardware processing component operating at the increased frequency; f) compute a difference between the first and second measured total power; g) compute a factor representing a workload dependent dynamic power value of that frequency domain N as a function of the computed measured total power difference and the clock frequency increase amount, and storing the workload dependent dynamic power of that frequency domain N; h) obtain a factor representing a workload dependent dynamic power value at each other frequency domain N associated with the hardware processing component of the IC; i) calculate a total workload dependent dynamic power value as a sum of all obtained workload dependent dynamic power values at all frequency domains; and j) compute a workload independent leakage power component value as the difference between the first total power measured and the calculated total workload dependent dynamic power value at the first rail voltage and temperature.

A computer program product is provided for performing operations. The computer program product includes a storage medium readable by a processing circuit and storing instructions run by the processing circuit for running a method. The method(s) are the same as listed above.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION

A system and method for post-Silicon characterization that accurately breaks down total hardware power components of a semiconductor device while running a workload, into workload dependent and workload-independent subcomponents.

The post-Silicon characterization implements techniques to enable accurate post-silicon leakage power characterization at very high temperatures, and at a much wider range of temperature and voltages, without the need for costly tester/heating infrastructure, without the need for additional hardware techniques/hardware counters.

In one embodiment, the semiconductor device is a multi-processor having one or more microprocessors (multiple microprocessors) in a core or core(s).

The post-Silicon characterization system and method provides the ability to breakdown total power of semiconductor chips measured, and also the ability to further breakdown hardware dynamic power measurements into sub-components.

Figure 1:
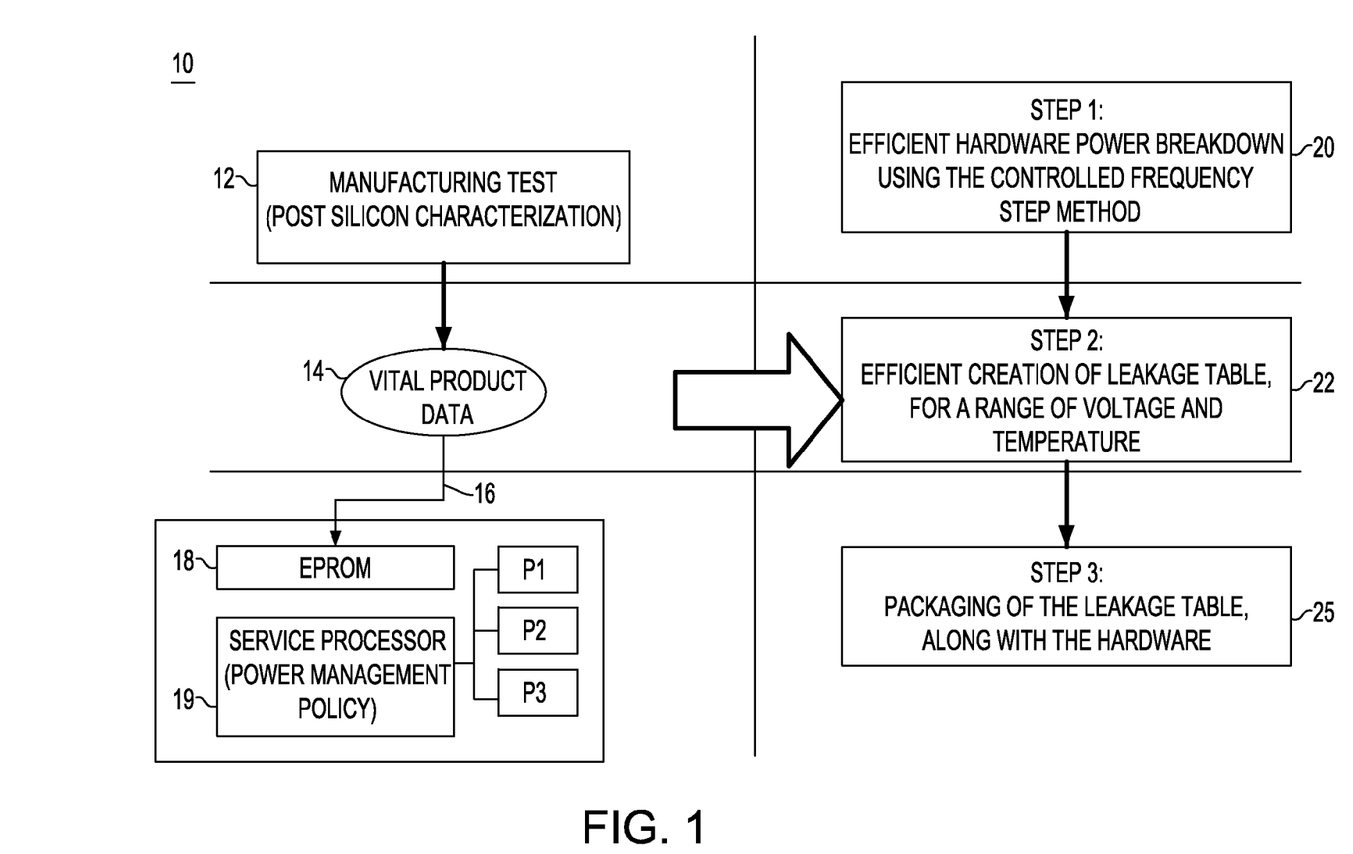
FIG. 1 shows a conceptual overview of a post-Silicon characterization system and method 10 in one embodiment.

FIG. 1 shows a conceptual overview of the post-Silicon characterization system and method 10 in one embodiment. At first step 12, there are performed techniques, described herein below in further detail, to efficiently break down the chips or macro's total hardware power, while running a workload, into separable sub-components (e.g., leakage and dynamic power) and without the need for additional hardware techniques/counters. The techniques implemented at 20, FIG. 1 include a controlled frequency step method to enable efficient extraction of separable power components from manufacturing test, for use in run-time power management. At 14, FIG. 1, the leakage power alone measurements, at elevated temperatures and voltages, provides valuable data that can be loaded into Leakage Power tables on-chip for use in run-time system level power management. Thus, at 22 there is depicted the efficient generating of a Leakage Table, for a range of voltage and temperature. Then, as shown at 16, FIG. 1, a memory storage device such as EEPROM device 18 is depicted receiving and storing the obtained leakage power data to form a leakage power table. At 25 there is depicted the packaging of the Leakage Table, along with the hardware. The data from leakage power table in EEPROM 18 is later used for run-time system level power management functions, e.g., as implemented by service processor 19 servicing the chip processor cores labeled P1, P2 and P3.

The system and method enables efficient and accurate post-silicon leakage power characterization at very high temperatures without the requirement nor use of external heaters or tester infrastructure. Rather, the system relies and leverages heat produced by dynamic power at high utilization workloads to produce heat, and then separates leakage power from dynamic power.

Figure 2:
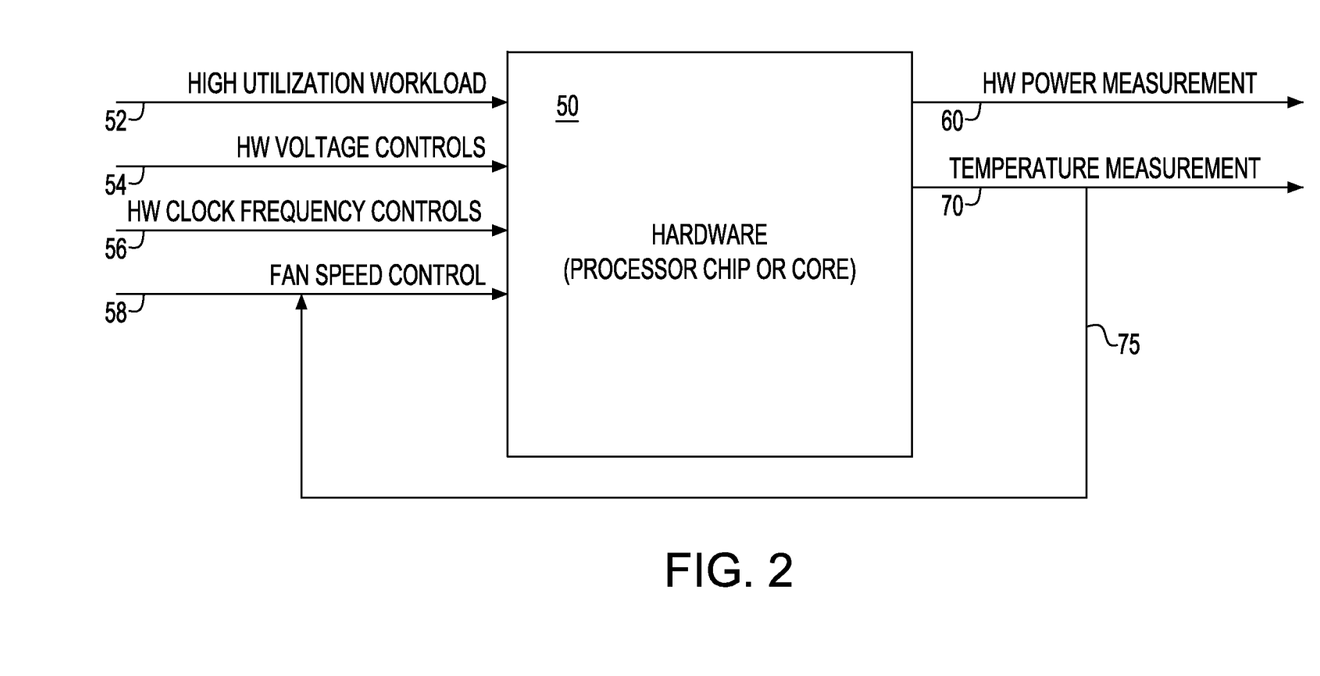
FIG. 2 shows an overview of the efficient hardware power breakdown using a Controlled Frequency step method applied to a newly manufactured processor chip or core 50.

In one embodiment, the system and method implement techniques to break down dynamic hardware power on a frequency domain basis referred to herein as a Controlled Frequency step method. In one embodiment, as shown in FIG. 2, there is provided an overview of the efficient hardware power breakdown using the Controlled Frequency step method. As shown in FIG. 2, given a newly manufactured processor chip or core 50 various inputs are provided in the manner described herein below to generate the hardware (HW) Power Measurement and Temperature Measurements 60, 70 respectively. Controlled inputs include a High Utilization Workload (a workload being software run on the processor core) 52, HW Voltage Control signals 54, HW Clock Frequency Control signals 56 and a Fan Speed Control signal 58. The Fan Speed Control signal 58 further includes feedback signal 75 including the output Temperature Measurements for regulating fan speed based on measured temperatures 70.

Figure 3A:
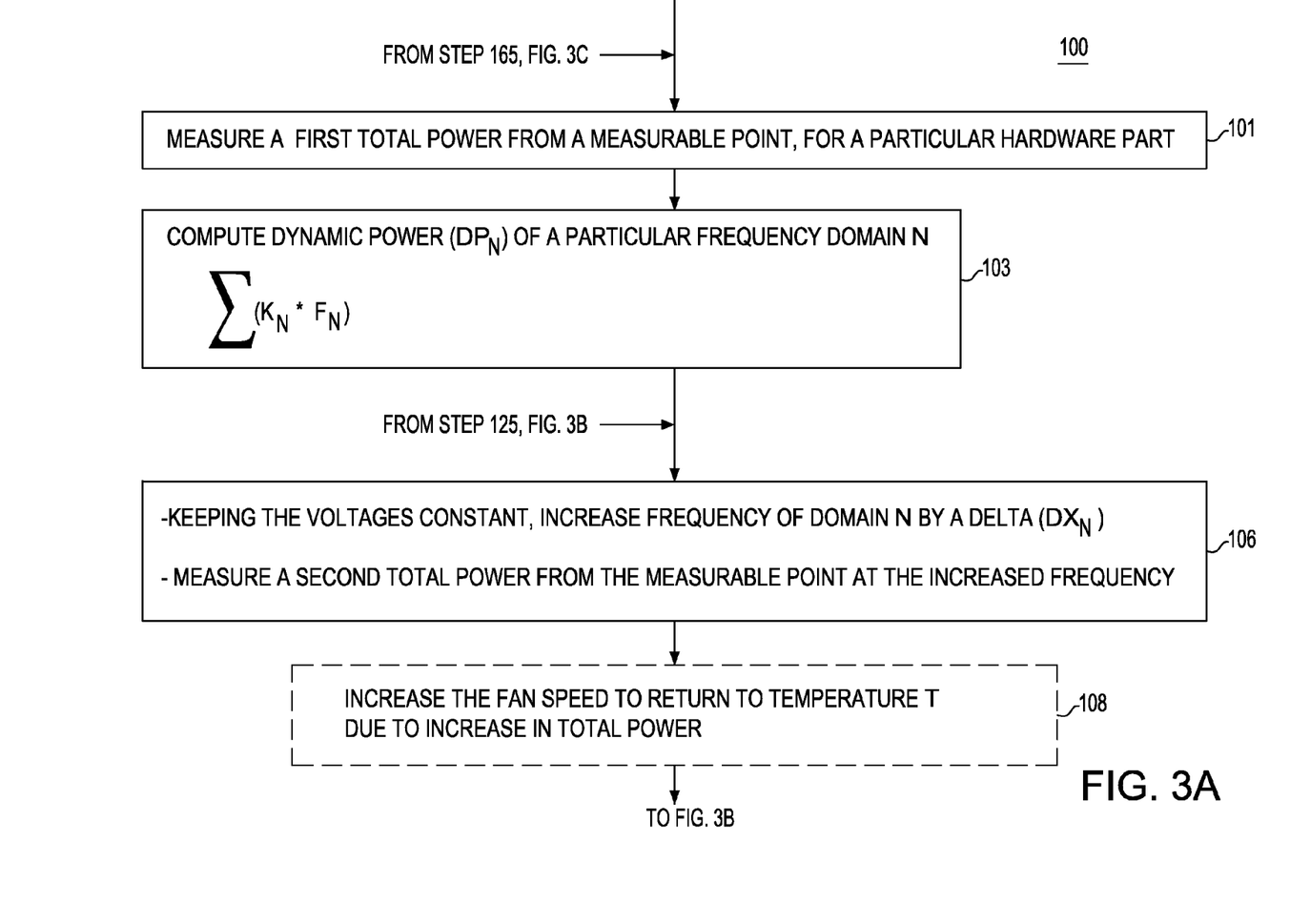
FIGS. 3A-3C depict a method 100 for measuring a total power of a semiconductor component, and particularly subcomponents of the newly manufactured processor chip or core, during a post-silicon power characterization phase.
Figure 3B:
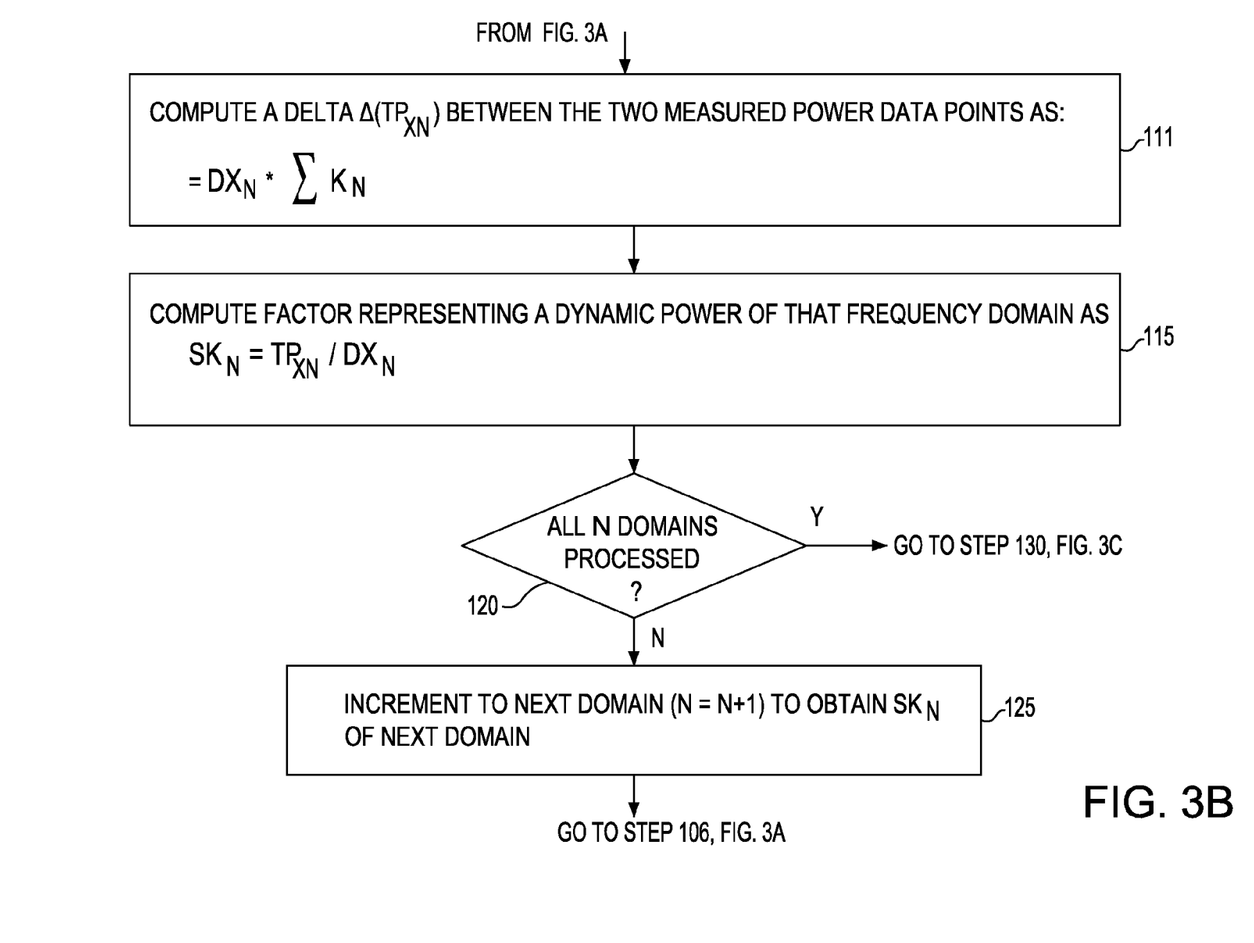

FIGS. 3A-3B depict a method 100 for measuring a total power of a semiconductor component, and particularly subcomponents of a microprocessor or core.

FIG. 3A, step 101 includes measuring a total power ("Total Power") consumed for a hardware component from a measurable point of the IC. Total Power (TP) measured from a measurable point for a particular hardware component, includes a dynamic power component ("Dynamic Power") and a leakage power component ("Leakage Power") and other components. In one embodiment, the Dynamic Power component is a function of voltage and frequency the hardware is operating at, and a workload the hardware component is running. Leakage Power and other components are a function of voltage, temperature the chip is operating at. That is:

TP=Dynamic Power (Voltage, Frequency, Workload)+
Leakage Power (Voltage, Temperature)+Others
(Voltage, Temperature)

Except for dynamic power, other components are workload-independent. However, as will be described herein below with respect to a further embodiment, the dependency of leakage power on a workload, for a processor with fine grained and coarse grained power gating, is addressed.

Figure 6:
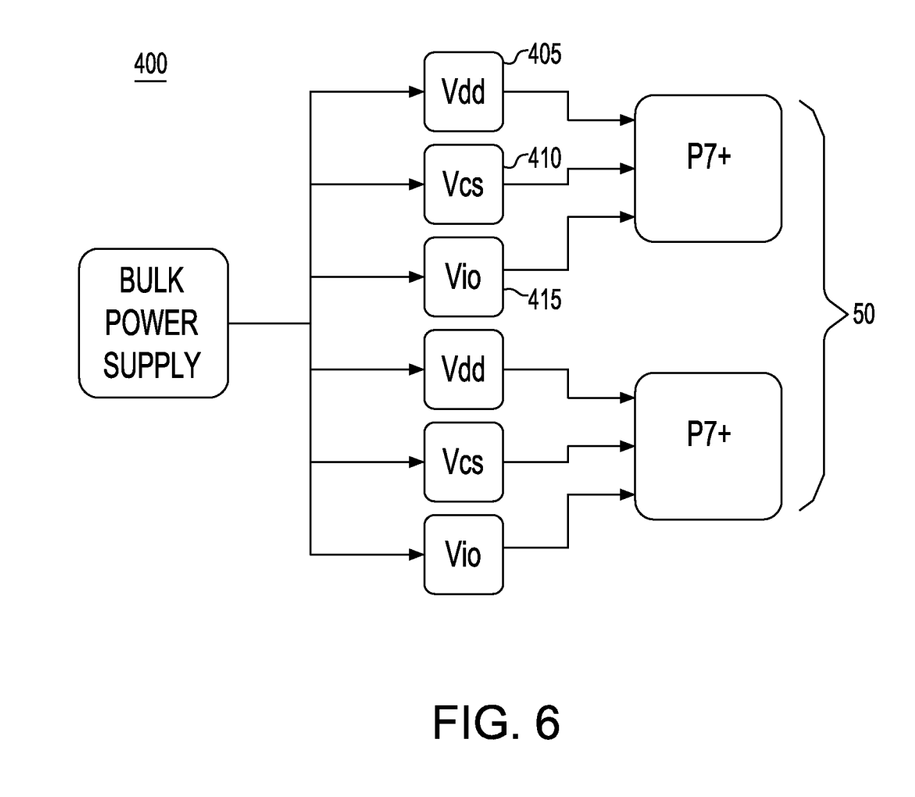
FIG. 6 shows the multiprocessor chip(s) 50 providing different voltage domains where total power measurements may be taken.

In one example, chip power consumption measurements may be taken at a particular voltage supply on the chip. FIG. 6 shows the (chip) voltage domain 400 for a Power7+ multiprocessor chip(s) 50 providing different voltage domains where measurements may be taken. The chip voltage domains are sourced from a bulk power supply 402 to provide VDD 405, VCS 410, VIO 415 and VMEM type voltage sources for various Power7+ chip components. For example, VDD powers the cores, logic, the cache memories, etc.; VCS domain powers the chiplet and chiplet array and DRAM supply for chiplet; VIO supply is for powering I/O receiver and transmitter, PLL, various communication busses, and VMEM supplies differential I/O (e.g., DDR I/O) etc. In one embodiment, total power measurements may be taken from a VDD or a VCS location.

The Dynamic Power component using Controlled Frequency step method is then computed at 103. More specifically, the Dynamic Power ($DP_N$) of a particular frequency domain N is a function of: a capacitance (C), a square of the operating voltage value (V), and a Workload_dependent_SF operating at frequency $F_N$ (operating frequency of domain N) where "SF" is a switch factor representing a particular workload. The characterization of $DP_N$ is shown at step 103, FIG. 1 is represented as:

$$DP_N = \sum (C*V*V*\text{Workload\_dependent\_SF}*F_N)$$
$$= \sum (K_N * F_N)$$

where each summation is a summation across all instances in that frequency domain and $K_N$ is a factor (for the domain N) representing the workload dependent ($C*V^2*$Workload_dependent_SF) characterization at domain N.

In one embodiment, the different frequency domains N for a Power7+ multiprocessor chip may include: a "core" operating frequency domain (e.g., a base core clock of 4 GHz), a "chiplet" base clock operating frequency (e.g., 2 GHz), Graphics card/adaptor domain (e.g., at nominal base frequency of 2.5 GHz); frequencies for different logic chips; memory reference clock for memory storage components (e.g., DRAM), and frequency domains associated with various port input/output components, graphics and various communication busses.

Thus, the frequency domains may be referred to herein as the root clocks (not shown), e.g., of the processor chip, because derived clocks (divided or multiplied clocks) are not generally controllable independent of the root clock frequency. Thus, it is understood that it may not be possible to breakdown the dynamic power on per domain basis, if the frequency domains/clocks are not independently controllable. For such derived domains, the dynamic power is still accounted for, but will be lumped across with the main clock.

For efficient hardware power breakdown, a next step includes a Controlled Frequency step at 106 where, keeping the voltages constant, the clock frequency of the measured hardware component is stepped to increase frequency of that domain N by small delta $DX_N$. This clock frequency increase may be implemented via controllable root clocks. The amount of frequency increase in domain N is to cause a measurable delta in dynamic (and total) power.

$$(DP_{N+X}) = \Sigma(K_N * (DX_N + F_N))$$

Then, as shown at step 106, FIG. 3A, a second "Total Power" measurement is obtained for the hardware component from the measurable point of the IC at the increased frequency.

In FIG. 2 output temperature measurement signal 70 is fed back as signal 75 for use in regulating fan speed control. Thus, for operating conditions where there is an increase in temperature, as shown in broken lines at 108, FIG. 3A, feedback signal 75 may be used by the processor to determine an increase in the fan speed based on the measured temperature increase to bring back the temperature to its prior operating value T. Increasing the fan speed keeps hardware component temperatures regulated. This will in effect cancel out increase in measured total power, and the leakage power component via increase in temperature dependent power components.

It is understood that in the Controlled Frequency step method, frequency and temperature can be modified using known techniques. Further, techniques are implemented that address impacts of on-chip temperature variation as discussed below.

Then, at 111, FIG. 3B, the system (programmed hardware processor) computes a delta $TP_{XN}$ between the two measured dynamic power data points as:

$$TP_{XN} = (DP_{N+X}) - (DP_N)$$
$$= \sum (K_N * DX_N)$$
$$= DX_N * \sum (K_N)$$

where $DX_N$ is a constant factor for all instances in this domain. Therefore, a factor $SK_N$ representative of the dynamic power of that frequency domain N is computed at 115, FIG. 3B as:

$$SK_N = \sum (K_N)$$
$$= TP_{XN} / DX_N$$

and stored in memory storage associated with the processor. Similarly, the steps of increasing frequency of domain N by small delta $DX_N$, (to bring in a measurable delta in dynamic and total power ($DP_{N+X}$)) and the computing the measured power delta $TP_{XN}$ are repeated for all N domains in the design. Thus, at 120, a decision is made as to whether all N frequency domains have been processed. If not all domains have been processed, then at 125, FIG. 3B, the domain N is incremented (e.g., defined as a "next" operating frequency domain N+1) to obtain/store the $SK_N$ dynamic power of that frequency domain. Each N factor $SK_N$ is representative of the dynamic power of that frequency domain, and is also a value independent of the frequency value. Then the process returns to step 106 and repeats the process steps 108, 111, 115 to obtain the $SK_N$ dynamic power at the next frequency domain.

Figure 3C:
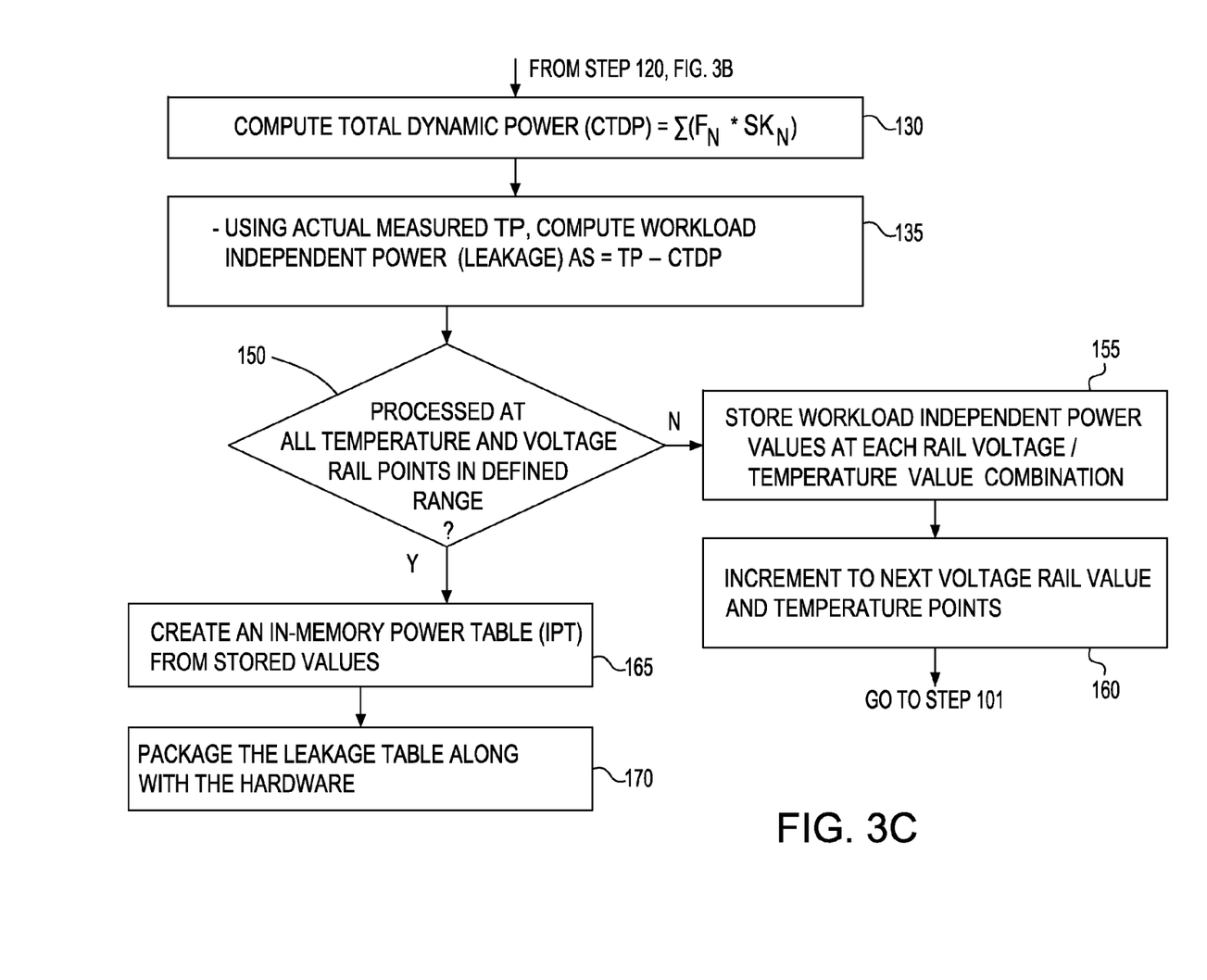

Returning to step 120, when determined that all N frequency domains have been processed and each of the N values of $SK_N$ are obtained/stored, the process proceeds to step 130, FIG. 3C. At this point, the total dynamic power for the rail being used for measurements is very accurately computed using:

Computed Total Dynamic Power (CTDP)=$\Sigma(F_N \times SK_N)$

This method enables very accurate, fast and fine grained post-silicon power dynamic power characterization on a per frequency domain basis.

Then at step 135, FIG. 3C, from the actual total power TP measured while running at the voltage condition and resulting temperature conditions, the workload independent power (mostly Leakage Power) can be calculated as:

Leakage Power=TP−CTDP

This Leakage Power component is dependent on rail voltage condition and resulting temperature $V_R$, $T_{NR}$ respectively. For example, running high utilization workloads may result in very high temperatures, and will thereby enable leakage power characterization data at high temperatures. As described below, this information is used, either during post-silicon system characterization or during boot-up, to create an in-memory table as shown in FIG. 4.

As Leakage Power component is dependent on rail voltage condition and resulting temperature $V_R$, $T_{NR}$ the process steps described herein above are repeated for each rail voltage condition $V_R$ and resulting temperature $T_{NR}$. Thus continuing to step 150 at FIG. 3C, a decision is made as to whether the Controlled Frequency process steps of FIGS. 3A-3C to obtain Leakage Power values have been processed at all temperature and voltage rail points, e.g., in a defined range. If not, steps 101-140 are repeated, e.g., for a pre-defined range of voltage and temperature points which varies from processor to processor based on its design and operable range. For instance, if at 150 it is determined that all temperature and voltage rail point conditions have not been processed, then the process proceeds to step 155 which includes storing the workload independent (i.e., Leakage) power values at the current rail voltage/temperature value combination. Then, the process proceeds to 160 where the method increments to next voltage rail value and temperature points, and the Controlled Frequency step process again repeats by returning to step 101, FIG. 3A at the new voltage rail/temperature values and repeating steps 101 through 150, FIG. 3C.

Returning to step 150, if it is determined that all temperature and voltage rail point conditions have been processed, the process continues at 165 where this consolidated information is used to create an in-memory power table (IPT). Then, the IPT table may then be packaged along with the hardware as indicated at 170.

Figure 4:
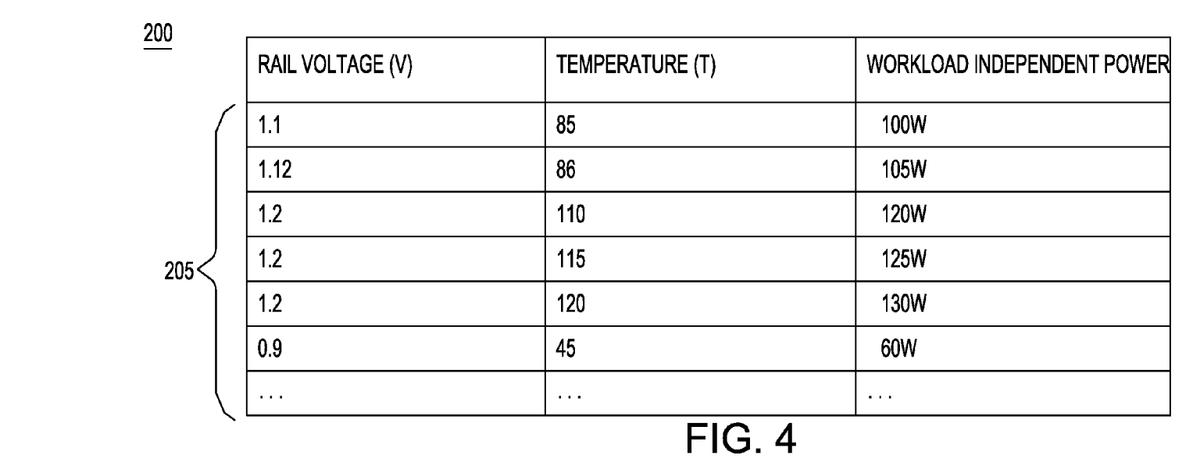
FIG. 4 shows the creation of an in-memory power table (IPT) obtained using data from the Controlled Frequency step method.

FIG. 4 shows an example IPT in-memory power table 200 having rows where each row indicates a record 205 specifying a combination of Rail Voltage (V) and Temperature (T) values and resulting computed workload independent power $SK_N$ values as determined implementing the methods described herein.

Figure 5:
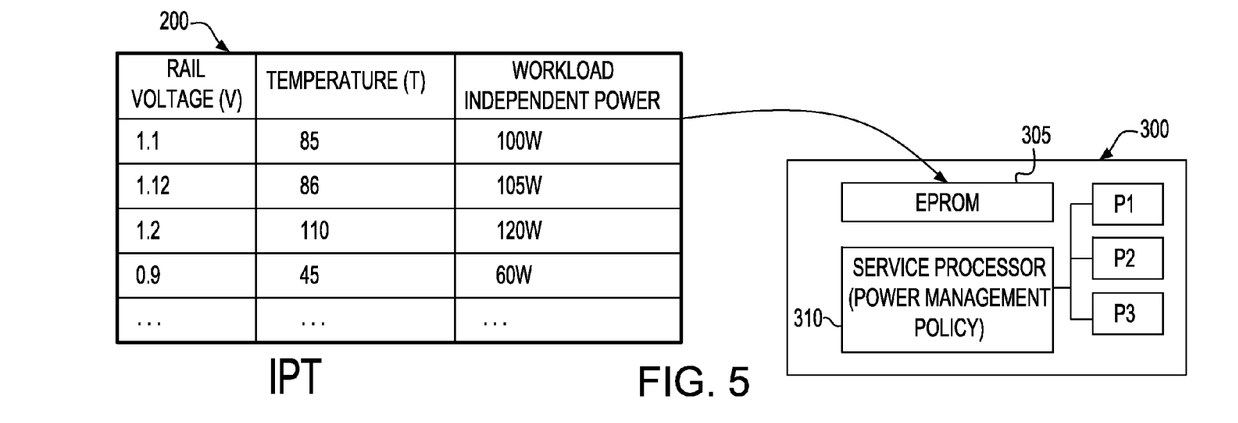
FIG. 5 shows a step of packaging the IPT table of FIG. 4 in an EEPROM device along with the processor chip hardware either during post-silicon system characterization or during boot-up.

FIG. 5 shows a step of packaging the IPT table 300 of FIG. 4 along with the hardware, a multi-processor chip including but not limited to cores P1, P2 P3 as shown including associated memory storage device such as an EEPROM (electrically erasable programmable read only memory) 305 as shown with respect to FIG. 5

The EEPROM 305 is shown receiving and storing the obtained leakage power data to form a leakage power table 200. The data from leakage power table in EEPROM 305 is later used for run-time system level power management functions, e.g., as implemented by service processor 310 servicing the chip processor blocks P1, P2 and P3 to control processor voltage and frequency based on compute loading and thermal data.

The creation of such accurate and extensive In-Memory Power Tables (IPT) is now obtained not only at lower end of the temperature spectrum but at the upper (higher) operating ends of the temperature spectrum. The exact range definition will vary from processor to processor. For example, for IBM P7+, temperatures up to 50° C. are on the lower end while 90° C. −100° C. forms the upper end of the range. Even while running any other workload on the system, including highly varying workloads, the IPT can be accessed for any rail voltage $V_R$, and temperature $T_{NR}$ combination, to compute workload-dependent power on the fly (in real-time).

workload-dependent power=Power from Sensor− Record from IPT.

To further improve the value (accuracy and granularity) of data generated in post silicon power characterization phase for use in run time power management services, the techniques described herein can be performed on a per processor core basis, rather than performing it for the entire processor chip.

Thus, the system and method enables finer grained pre to post silicon power correlation, and the ability to breakdown total power measured, and also the ability to further breakdown hardware dynamic power measurements into sub-components. This provides a huge value add for the next generation of pre-silicon dynamic power modeling and analysis improvements.

The system and method thus provides the ability to further enable the leakage power measurements, at elevated temperatures and voltages, provides valuable data to improve the next generation of leakage power modeling at corner conditions having high values of voltages and/or temperature, when compared to the normal operation range.

The techniques and methodology in producing the IPT as described herein above may be implemented in chip designs that implement power gating in which mechanisms are used to turn off unused components or circuits (power gating) of the chip.

Thus, in a further embodiment, during the post silicon power characterization phase (unlike in real-time scenarios), the workload running on the chip hardware is precisely controlled with further controls implemented to enable any of the different power gating techniques provided in the hardware, at different levels of granularity.

For e.g., in Power7+ processor and later p-processors, it can be precisely controlled which cores are power gated and which cores are not (e.g., using power headers). That is, during this mode of operation, the logic built into the system or chip can override (turn off) the power gating techniques.

Similar techniques to disable power gating for the different processor blocks are available in processors (such as via a configuration registry).

In an alternate implementation, the activation of workload driven power gating techniques drops significantly when the utilization of the different blocks in the processor are high. For such processors, which provide fine grained power gating techniques, the impact of power gating effect can be drastically minimized by running a high utilization workload during post silicon power characterization phase. As demonstrated herein above, running a high utilization workload is performed in a loop during post silicon power characterization, and is required to achieve high temperature points (as mentioned herein above), and involves no additional measures.

While in one embodiment it is advantageous to define a workload which utilizes an entire processor chip, i.e., all processor units running at very high utilization, defining a workload which stresses just one processor core is a much easier task during post silicon power characterization. To handle this scenario, the techniques described herein above may be performed on a per processor core basis, rather than performing all steps for the entire processor chip. This along with running of high utilization workloads will further ensure accuracy, without any loss in the value for use in both post silicon characterization and run-time power management space.

Moreover, with respect to any resulting on-chip temperature variations caused by running workloads, it is understood that temperature sensors are employed to give feedback for controlling the fan or other cooling rate in order to maintain constant temperature. But there may be significant temperature variation across the chip, because this temperature variation depends on local power consumption, which itself is workload-dependent. Thus, for the post silicon power characterization phase (unlike in real-time scenarios), there is exercised precise control of what workload is running and how it is running on the hardware. Thus, in the power characterization phase the temperature of the cores can be very precisely controlled, e.g., a high utilization workload is run on all/subset of the processor cores, in an infinite loop. In this scenario, the temperature from different points in a processor chip will be almost a constant for all practical purposes.

Moreover, the workload running on the hardware processing component may be varied to change temperature (e.g., by clock frequency, throttling, idling instructions in said workload)

A temperature gradient across the chip at a point in time is referred to herein as $T(x,y)$. As per the method, when increasing the frequency, one clock is increased by a very small delta, e.g., just enough to cause a measurable delta in power (e.g., a couple of mW). This small delta in frequency may not cause a real delta in either average temperature or $T(x,y)$. So essentially, the leakage extracted for post silicon power characterization is for a particular $T(x,y)$ gradient, and not a single value of T. This $T(x,y)$ may then be averaged to form a single value T (for indexing leakage measurements) for use in run time power management servicing.

That is, in one embodiment, even if the workload running causes notable temperature gradient within a single processor core, the readings from the different sensors can be averaged to get a single value, to index the leakage value from post silicon power characterization for use in run time chip power management.

The system and method further enables efficient usage of above information in chip/system Level Power management techniques.

From a system Power Management viewpoint: the system and method when implemented by a computing system provides for faster convergence of a TAPO-Server which implements methods of setting fan power to minimize the sum of the chip power consumption and the fan power. It is expected that more accurate leakage power estimations should help the TAPO feedback-controller converge to setting the optimal fan speed quicker. It also provides for Leakage Power Driven Fan Speed Control Algorithms. It additionally improves the accuracy of several existing use-cases and applications of in-memory leakage tables, created from empirical models.

The methods described herein may be further used in Dynamic Power Management Techniques used in "charge-back" applications, where it is desirable to charge the system user for active power, not idle (leakage) power. Thus, separating the two becomes important.

In a further embodiment, the system and method enables the prediction of leakage power resulting from running the fan at different speeds, to help optimize total power of a system by the trade-off between fan power and leakage power.

Figure 7:
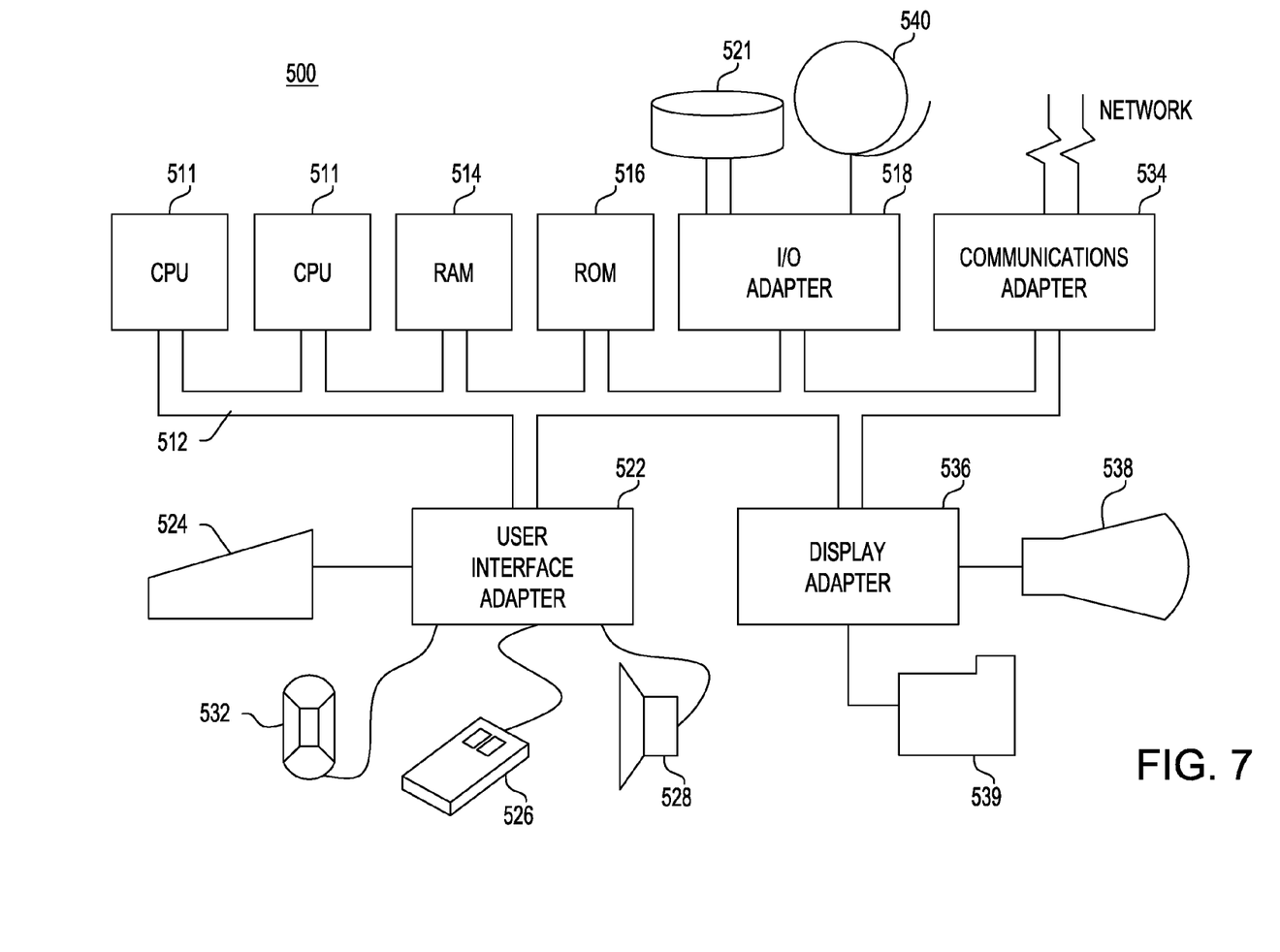
FIG. 7 illustrates an exemplary computing system that can run the methods illustrated in FIGS. 3A-3C in one embodiment.

FIG. 7 illustrates an exemplary hardware configuration of a computing device computing system infrastructure 500 in which the present methods are run. In one aspect, computing system 500 is programmed to perform the controlled frequency process steps depicted in FIGS. 3A-3C and any run time power management service using the data obtained by the methods. The hardware configuration preferably has at least one processor or central processing unit (CPU) 511. The CPUs 511 are interconnected via a system bus 512 to a random access memory (RAM) 514, read-only memory (ROM) 516, input/output (I/O) adapter 518 (for connecting peripheral devices such as disk units 521 and tape drives 540 to the bus 512), user interface adapter 522 (for connecting a keyboard 524, mouse 526, speaker 528, disk drive device 532, and/or other user interface device to the bus 512), a communication adapter 534 for connecting the system 500 to a data processing network, the Internet, an Intranet, a local area network (LAN), etc., and a display adapter 536 for connecting the bus 512 to a display device 538 and/or printer 539 (e.g., a digital printer of the like).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc. or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to FIGS. 3A-3C, the flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. A method of obtaining leakage power value for an integrated circuit (IC) chip having hardware processing components comprising:
   (a) running a programmed workload on a hardware processing component of the IC, said hardware processing component operating at an applied first voltage supply rail and temperature combination;
   (b) measuring a first total power consumed for the hardware processing component of said IC from a measurable point thereof;
   (c) computing a workload dependent measure of dynamic power of a frequency domain N with the hardware processing component operating at a frequency $F_N$;
   (d) increasing a clock frequency input applied to the hardware processing component that results in an increase in said total power consumed by said hardware processing component associated with a domain N;
   (e) measuring a second total power consumed for the hardware processing component operating at the increased frequency;
   (f) computing a difference between the first and second measured total power;
   (g) computing a factor representing a workload dependent dynamic power value of that frequency domain N as a function of said computed measured total power difference and said clock frequency increase amount, and storing said workload dependent dynamic power of that frequency domain N;
   (h) obtaining a factor representing a workload dependent dynamic power value at each other frequency domain N associated with the hardware processing component of said IC;

(i) calculating a total workload dependent dynamic power value as a sum of all obtained workload dependent dynamic power value factors at all frequency domains; and (j) computing a workload independent leakage power component value as the difference between the first total power measured and said calculated total workload dependent dynamic power value at the first rail voltage and temperature.

2. The method of claim 1, wherein said obtaining a workload dependent dynamic power value at each other frequency domain N comprises:

defining another frequency domain N+1 associated with another operating frequency of said hardware processing component as a next frequency domain N;

repeating said steps (d) to (g) to obtain a workload dependent dynamic power at that other frequency domain N; and iterating between said defining and said repeating (d)-(g) steps until all frequency domains are processed.

3. The method of claim 2, wherein said calculating said total workload dependent dynamic power value further comprises:

for each domain N, obtaining a product of said factor representing said computed workload dependent dynamic power value and said operating frequency value at that domain N; and computing a total dynamic power (CTDP) as a summation of each obtained product for all domains N.

4. The method of claim 3, further comprising:

defining another voltage supply rail value and temperature value combination; and repeating said steps (a)-(g) to obtain a total dynamic power (CTDP) at said defined another voltage supply rail and temperature value combination; and iterating between said defining and said repeating (a)-(g) steps until all other defined voltage supply rail and temperature value combinations are processed.

5. The method of claim 4, further comprising:

computing a workload independent leakage power component as the difference between the first total power measured and said calculated total workload dependent dynamic power value at each said another voltage supply rail and temperature combination.

6. The method of claim 5, further comprising:

storing in a table of said IC, each computed workload independent leakage power component value as a function of a corresponding voltage supply rail and temperature combination value, said single temperature value used to index the workload independent leakage value for use in run time chip power management.

7. The method of claim 1, further comprising: detecting, responsive to the frequency increase in domain N, a measurable change in dynamic and total power.

8. The method of claim 1, wherein increasing said frequency domain N is via controllable root clocks.

9. The method of claim 1, further comprising:

obtaining temperature measurements from one or more temperature sensors on said IC;

detecting from said obtained temperature measurements a temperature gradient within the hardware processing component caused by said running workload;

averaging the obtained temperature measurements from the different sensors to get a single temperature value.

10. The method of claim 1, wherein responsive to said increase in frequency, said method further comprising:

detecting an increase in temperature due to said applied frequency increase;

modifying a speed of a fan to regulate a temperature of said chip responsive to said detected temperature increase; wherein said regulated temperature being a temperature value of said hardware processing component measured prior to said applied frequency increase.

11. The method of claim 1, wherein said hardware processing component is a microprocessor core of a multiprocessor hardware having plural microprocessor cores.

12. A computer program product for obtaining leakage power value for an integrated circuit (IC) chip having hardware processing components comprising:

a computer readable storage medium, said medium not a propagating signal, said medium tangibly embodying a program of instructions executable by a computer system for:

(a) running a programmed workload on a hardware processing component of the IC, said hardware processing component operating at an applied first voltage supply rail and temperature combination;

(b) measuring a first total power consumed for the hardware processing component of said IC from a measurable point thereof;

(c) computing a workload dependent measure of dynamic power of a frequency domain N with the hardware processing component operating at a frequency $F_N$;

(d) increasing a clock frequency input applied to the hardware processing component that results in an increase in said total power consumed by said hardware processing component associated with a domain N;

(e) measuring a second total power consumed for the hardware processing component operating at the increased frequency;

(f) computing a difference between the first and second measured total power;

(g) computing a factor representing a workload dependent dynamic power value of that frequency domain N as a function of said computed measured total power difference and said clock frequency increase amount, and storing said workload dependent dynamic power of that frequency domain N;

(h) obtaining a factor representing a workload dependent dynamic power value at each other frequency domain N associated with the hardware processing component of said IC;

(i) calculating a total workload dependent dynamic power value as a sum of all obtained workload dependent dynamic power values at all frequency domains; and (j) computing a workload independent leakage power component value as the difference between the first total power measured and said calculated total workload dependent dynamic power value at the first rail voltage and temperature.

13. The computer program product of claim 12, wherein said obtaining a workload dependent dynamic power value at each other frequency domain N comprises:

defining another frequency domain N+1 associated with another operating frequency of said hardware processing component as a next frequency domain N;

repeating said steps (d) to (g) to obtain a workload dependent dynamic power at that other frequency domain N; and iterating between said defining and said repeating (d)-(g) steps until all frequency domains are processed.

14. The computer program product of claim 13, wherein said calculating said total workload dependent dynamic power value further comprises:
for each domain N, obtaining a product of said factor representing said computed workload dependent dynamic power value and said operating frequency value at that domain N; and
computing a total dynamic power (CTDP) as a summation of each obtained product for all domains N.

15. The computer program product of claim 14, further comprising instructions for:
defining another voltage supply rail value and temperature value combination; and
repeating said steps (a)-(g) to obtain a total dynamic power (CTDP) at said defined another voltage supply rail and temperature value combination; and
iterating between said defining and said repeating (a)-(g) steps until all other defined voltage supply rail and temperature value combinations are processed.

16. The computer program product of claim 15, further comprising instructions for:
computing a workload independent leakage power component as the difference between the first total power measured and said calculated total workload dependent dynamic power value at each said another voltage supply rail and temperature combination.

17. The computer program product of claim 16, further comprising instructions for:
storing in a table of said IC, each computed workload independent leakage power component value as a function of a corresponding voltage supply rail and temperature combination value, said single temperature value used to index the workload independent leakage value for use in run time chip power management.

18. The computer program product of claim 12, further comprising instructions for:
obtaining temperature measurements from one or more temperature sensors on said IC;
detecting from said obtained temperature measurements a temperature gradient within the hardware processing component caused by said running workload;
averaging the obtained temperature measurements from the different sensors to get a single temperature value.

19. The computer program product of claim 12, further comprising instructions for:
detecting an increase in temperature due to said applied frequency increase; and
modifying a speed of a fan to regulate a temperature of said chip responsive to said detected temperature increase; wherein said regulated temperature being a temperature value of said hardware processing component measured prior to said applied frequency increase.

20. A system for obtaining leakage power value for an integrated circuit (IC) chip having hardware processing components comprising:
a memory storage device;
a processor device in communication with said memory storage device, said processor device configured to perform a method to:
(a) run a programmed workload on a hardware processing component of the IC, said hardware processing component operating at an applied first voltage supply rail and temperature combination;
(b) measure a first total power consumed for the hardware processing component of said IC from a measurable point thereof;
(c) compute a workload dependent measure of dynamic power of a frequency domain N with the hardware processing component operating at a frequency $F_N$;
(d) increase a clock frequency input applied to the hardware processing component that results in an increase in said total power consumed by said hardware processing component associated with a domain N;
(e) measure a second total power consumed for the hardware processing component operating at the increased frequency;
(f) compute a difference between the first and second measured total power;
(g) compute a factor representing a workload dependent dynamic power value of that frequency domain N as a function of said computed measured total power difference and said clock frequency increase amount, and storing said workload dependent dynamic power of that frequency domain N;
(h) obtain a factor representing a workload dependent dynamic power value at each other frequency domain N associated with the hardware processing component of said IC;
(i) calculate a total workload dependent dynamic power value as a sum of all obtained workload dependent dynamic power values at all frequency domains; and
(j) compute a workload independent leakage power component value as the difference between the first total power measured and said calculated total workload dependent dynamic power value at the first rail voltage and temperature.

* * * * *